United States Patent
Mikawa et al.

(10) Patent No.: US 9,192,910 B2
(45) Date of Patent: Nov. 24, 2015

(54) PROCESS FOR PRODUCING NITRIDE CRYSTAL, NITRIDE CRYSTAL AND APPARATUS FOR PRODUCING SAME

(75) Inventors: Yutaka Mikawa, Ushiku (JP); Makiko Kiyomi, Ushiku (JP); Yuji Kagamitani, Sendai (JP); Toru Ishiguro, Sendai (JP)

(73) Assignees: Mitsubishi Chemical Corporation, Tokyo (JP); Tohoku University, Sendai-shi (JP)

( * ) Notice: Subject to any disclaimer, the term of this patent is extended or adjusted under 35 U.S.C. 154(b) by 264 days.

(21) Appl. No.: 13/143,094

(22) PCT Filed: Jan. 7, 2010

(86) PCT No.: PCT/JP2010/050118
§ 371 (c)(1),
(2), (4) Date: Jul. 1, 2011

(87) PCT Pub. No.: WO2010/079814
PCT Pub. Date: Jul. 15, 2010

(65) Prior Publication Data
US 2011/0268645 A1 Nov. 3, 2011

(30) Foreign Application Priority Data

Jan. 8, 2009 (JP) ................................. 2009-002189
Aug. 26, 2009 (JP) ................................. 2009-195856

(51) Int. Cl.
*B01J 19/02* (2006.01)
*C30B 7/10* (2006.01)
*C30B 29/40* (2006.01)
*H01L 21/02* (2006.01)

(52) U.S. Cl.
CPC ................ *B01J 19/02* (2013.01); *C30B 7/105* (2013.01); *C30B 29/403* (2013.01); *H01L 21/0254* (2013.01); *H01L 21/0262* (2013.01); *H01L 21/02389* (2013.01); *H01L 21/02425* (2013.01); *H01L 21/02433* (2013.01); *B01J 2219/0236* (2013.01); *Y10T 117/1096* (2015.01)

(58) Field of Classification Search
None
See application file for complete search history.

(56) References Cited

U.S. PATENT DOCUMENTS 7,335,262 B2 * 2/2008 Dwilinski et al. ............ 117/206
2003/0209191 A1 11/2003 Purdy
(Continued)

FOREIGN PATENT DOCUMENTS

CN 101297397 A 10/2008
JP 2003 277182 10/2003
(Continued)

OTHER PUBLICATIONS

U.S. Appl. No. 13/481,989, filed May 29, 2012, Mikawa, et al.
(Continued)

*Primary Examiner* — Guinever S Gregorio
(74) *Attorney, Agent, or Firm* — Oblon, McClelland, Maier & Neustadt, L.L.P.

(57) ABSTRACT

To grow a highly pure nitride crystal having a low oxygen concentration efficiently by an ammonothermal method.
A process for producing a nitride crystal, which comprises bringing a reactant gas reactive with ammonia to form a mineralizer, and ammonia into contact with each other to prepare a mineralizer in a reactor or in a closed circuit connected to a reactor; and growing a nitride crystal by an ammonothermal method in the presence of the ammonia and the mineralizer.

27 Claims, 1 Drawing Sheet

(56) References Cited

U.S. PATENT DOCUMENTS

| | | | |
|---|---|---|---|
| 2004/0031978 A1 | 2/2004 | D'Evelyn et al. | |
| 2004/0124434 A1 | 7/2004 | D'Evelyn et al. | |
| 2005/0009310 A1 | 1/2005 | Vaudo et al. | |
| 2006/0169996 A1* | 8/2006 | D'Evelyn et al. | 257/94 |
| 2008/0087919 A1* | 4/2008 | Tysoe et al. | 257/201 |
| 2008/0102016 A1* | 5/2008 | Hashimoto | 423/409 |
| 2009/0081110 A1 | 3/2009 | Shibata et al. | |
| 2009/0092536 A1 | 4/2009 | Kawabata et al. | |
| 2010/0126411 A1* | 5/2010 | Letts et al. | 117/89 |
| 2010/0294195 A1* | 11/2010 | Katou et al. | 117/73 |
| 2014/0190403 A1* | 7/2014 | Fujito et al. | 117/224 |

FOREIGN PATENT DOCUMENTS

| | | |
|---|---|---|
| JP | 2004 002152 | 1/2004 |
| JP | 2005 8444 | 1/2005 |
| JP | 2005 289797 | 10/2005 |
| JP | 2006 513122 | 4/2006 |
| JP | 2007 039321 | 2/2007 |
| JP | 2007 238347 | 9/2007 |
| JP | 2007 290921 | 11/2007 |
| JP | 2007 534580 | 11/2007 |
| JP | 2008 143778 | 6/2008 |
| JP | 2008 179536 | 8/2008 |
| JP | 2008 239481 | 10/2008 |
| WO | 2004 061923 | 7/2004 |
| WO | 2008 133653 | 11/2008 |

OTHER PUBLICATIONS

Ehrentraut, D., et al., "Reviewing recent developments in the acid ammonothermal crystal growth of gallium nitride," Journal of Crystal Growth, vol. 310, pp. 3902-3906, (Jun. 8, 2008).

Hashimoto, T., et al., "Status and perspectives of the ammonothermal growth of GaN substrates," Journal of Crystal Growth, vol. 310, pp. 876-880, (Nov. 22, 2007).

Kagamitani, Y., et al., "High purity GaN growth by the ammonothermal method using an acidic mineralizer," The 36$^{th}$ International Symposium on Compound Semiconductors, total 2 pages. (Sep. 2, 2009).

International Search Report issued Apr. 6, 2010 in PCT/JP10/050118 filed Jan. 7, 2010.

Combined Chinese Office Action and Search Report issued Jun. 26, 2013, in Chinese Patent Application No. 201080004166.0 with English translation.

Extended European Search Report issued Oct. 16, 2014 in Application No. 10729234.4.

U.S. Appl. No. 14/500,516, filed Sep. 29, 2014, Ishiguro, et al.

* cited by examiner

PROCESS FOR PRODUCING NITRIDE CRYSTAL, NITRIDE CRYSTAL AND APPARATUS FOR PRODUCING SAME

TECHNICAL FIELD

The present invention relates to a process for producing a nitride crystal by an ammonothermal method, a nitride crystal and an apparatus for producing the same. Particularly, the present invention relates to a process for producing a nitride crystal by an ammonothermal method, which is characterized by the method of supplying a mineralizer.

BACKGROUND ART

An ammonothermal method is a method for producing a desired material by using an ammonia solvent in a supercritical state and/or a subcritical state and utilizing the dissolution-precipitation reaction of a starting material. When employed for a crystal growth, the method utilizes temperature dependency of the solubility of a starting material in an ammonia solvent to generate a supersaturated state by a temperature difference and thereby to precipitate a crystal. A hydrothermal method, which is similar to the ammonothermal method, uses water in a supercritical state and/or a subcritical state as a solvent, to carry out crystal growth, and it is employed mainly for oxide crystals such as quartz ($SiO_2$) and zinc oxide (ZnO). On the other hand, the ammonothermal method may be employed for nitride crystals, and it is utilized for growth of nitride crystals such as gallium nitride. In order to grow a single crystal by the ammonothermal method, a sufficient amount of a starting material is required to be present for precipitation in a supersaturated state, and this requires the starting material for crystal growth to be sufficiently soluble in a solvent. However, since a nitride such as gallium nitride has an extremely low solubility in pure ammonia within the applicable range of temperature and pressure, there is a problem such that the starting material cannot be dissolved in an amount required for a practical crystal growth.

In order to solve such a problem, a mineralizer, which increases the solubility of a nitride such as gallium nitride, is usually added to the reaction system. A mineralizer forms e.g. a complex with a nitride (solvation), and a larger amount of the nitride can thereby be dissolved in ammonia. Such mineralizers include a basic mineralizer and an acidic mineralizer. A representative example of the basic mineralizer may be an alkali metal amide, and a representative example of the acidic mineralizer may be an ammonium halide (Patent Document 1).

These mineralizers are sold as reagents, and they are usually available in a solid powder form. Such a solid mineralizer is sufficiently dried and then put in a reactor which contains a starting material for crystal growth and a seed crystal, and then the lid is closed. Next, liquid ammonia is injected into the reactor via a valve, followed by raising the temperature by a heater to generate an internal pressure by volume expansion of the internal ammonia. Then, the reactor is maintained under a set temperature condition for a prescribed period of time to grow a crystal, followed by cooling and recovering the crystal from the reactor, to obtain a nitride crystal (Patent Documents 2 to 4).

However, there is a problem such that such a nitride crystal grown by an ammonothermal method using a solid mineralizer has a relatively high concentration of oxygen contained in the crystal. That is, the nitride crystal obtained by the above conventional process contains oxygen in an amount of, in orders of magnitude, $10^{18}$ to $10^{20}$ atom/$cm^3$ (Non-Patent Documents 1 and 2), which is an extremely large value as compared with a nitride crystal grown by HVPE method.

PRIOR ART DOCUMENTS

Patent Documents

Patent Document 1: JP-A-2003-277182
Patent Document 2: JP-A-2005-8444
Patent Document 3: JP-A-2007-238347
Patent Document 4: JP-A-2007-290921

Non-Patent Documents

Non-Patent Document 1: Journal of Crystal Growth, 310, 2008, 3902-3906
Non-Patent Document 2: Journal of Crystal Growth, 310, 2008, 876-880

DISCLOSURE OF INVENTION

Technical Problem

If the oxygen concentration is high, black to brown coloration results, and when the nitride crystal is used as a substrate for opto-electronics such as LEDs and LDs (laser diodes), absorption of light occurs, and thus light recovery efficiency is declined. Further, since oxygen functions as a donor, if an uncontrolled amount of oxygen is contained in the crystal as an unintended impurity, doping to control electric properties of a substrate becomes difficult. Therefore, it is required to reduce the oxygen concentration in the crystal. This is required also from the viewpoint of the crystal growth rate or crystallinity of a crystal to be obtained. However, heretofore, such a problem has been recognized as an unavoidable inherent problem as long as an ammonothermal method is employed, and a solution to the problem has not been found at all.

Taking such a problem of the prior art into consideration, the present inventors have conducted a study for the purpose of obtaining a nitride crystal having a low oxygen concentration, consciously by an ammonothermal method.

Solution to Problem

As a result of an extensive study to solve the above problem, the present inventors have found that when a mineralizer is supplied by a novel method which has not been studied in the conventional method, a nitride crystal having a low oxygen concentration can be obtained by an ammonothermal method, and they have accomplished the present invention. That is, in order to solve the problem, the present invention provides the following.

[1] A process for producing a nitride crystal, which comprises bringing a reactant gas reactive with ammonia to form a mineralizer, and ammonia into contact with each other to prepare a mineralizer in a reactor or in a closed circuit connected to a reactor; and in the reactor, growing a nitride crystal from a starting material for growth of a nitride crystal put in the reactor, by an ammonothermal method in the presence of ammonia and the mineralizer.

[2] The process for producing a nitride crystal according to [1], wherein the reactant gas is a hydrogen halide gas.

[3] The process for producing a nitride crystal according to [2], wherein the reactant gas is at least one member selected from the group consisting of a hydrogen chloride gas, a hydrogen bromide gas and a hydrogen iodide gas.

[4] The process for producing a nitride crystal according to any one of [1] to [3], wherein the reactant gas is supplied to the ammonia to prepare a mineralizer.

[5] The process for producing a nitride crystal according to any one of [1] to [4], wherein the reactant gas has a water content of at most 10 ppm (by weight).

[6] The process for producing a nitride crystal according to any one of [1] to [5], wherein the reactant gas has an oxygen content of at most 10 ppm (by weight).

[7] The process for producing a nitride crystal according to any one of [1] to [3], wherein the reactant gas is formed by reacting a plurality of material gases.

[8] The process for producing a nitride crystal according to [7], wherein the plurality of material gases are supplied to the ammonia to prepare a mineralizer.

[9] The process for producing a nitride crystal according to [7] or [8], wherein each of the material gases has a water content of at most 10 ppm (by weight).

[10] The process for producing a nitride crystal according to any one of [7] to [9], wherein each of the material gases has an oxygen content of at most 10 ppm (by weight).

[11] The process for producing a nitride crystal according to any one of [7] to [10], wherein the plurality of material gases comprise a first material gas and a second material gas, said first material gas being a halogen and said second material gas being a gas reactive with halogen to form the reactant gas.

[12] The process for producing a nitride crystal according to [11], wherein the second material gas is a gas of at least one member selected from the group consisting of an alkane and a halogenated alkane having a hydrogen atom.

[13] The process for producing a nitride crystal according to [12], wherein the first material gas is a chlorine gas, and the second material gas is a gas of at least one member selected from the group consisting of methane, monochloromethane, dichloromethane and trichloromethane.

[14] The process for producing a nitride crystal according to any one of [1] to [13], wherein the reactant gas or the plurality of material gases forming the reactant gas is introduced into the reactor charged with ammonia to prepare a mineralizer.

[15] The process for producing a nitride crystal according to any one of [1] to [13], wherein in the closed circuit connected to a reactor i.e. outside the reactor, the reactant gas or the plurality of material gases forming the reactant gas are introduced into ammonia to prepare a mineralizer, and then ammonia containing the prepared mineralizer is introduced into the reactor to grow a nitride crystal.

[16] The process for producing a nitride crystal according to [14] or [15], wherein the reactant gas or the plurality of material gases forming the reactant gas are passed through a filter and then introduced.

[17] The process for producing a nitride crystal according to any one of [14] to [16], wherein the reactor is lined with at least one metal or with an alloy of at least one metal, selected from the group consisting of Pt, Ir, W, Ta, Rh, Ru and Re.

[18] The process for producing a nitride crystal according to any one of [14] to [17], wherein the reactor is an autoclave.

[19] The process for producing a nitride crystal according to any one of [14] to [17], wherein the reactor is an inner cylindrical tube inserted in an autoclave.

[20] The process for producing a nitride crystal according to any one of [14] to [19], wherein, before ammonia and the reactant gas, or ammonia and the plurality of material gases are introduced into the reactor or the closed circuit connected to a reactor, the interior of the reactor containing a starting material for growth of a crystal is replaced with a nitrogen gas.

[21] The process for producing a nitride crystal according to any one of [14] to [20], wherein, before ammonia and the reactant gas, or ammonia and the plurality of material gases are introduced into the reactor or the closed circuit connected to a reactor, the pressure in the reactor containing a starting material for growth of a crystal is reduced to at most 10 Torr.

[22] The process for producing a nitride crystal according to any one of [14] to [21], wherein, before ammonia and the reactant gas, or ammonia and the plurality of material gases are introduced into the reactor or the closed circuit connected to a reactor, the interior of the reactor containing a starting material for growth of a crystal is heated to at least 70° C.

[23] The process for producing a nitride crystal according to any one of [1] to [22], wherein the nitride crystal is a Group III nitride crystal.

[24] The process for producing a nitride crystal according to any one of [1] to [22], wherein the nitride crystal is a nitride crystal containing gallium.

[25] The process for producing a nitride crystal according to [24], wherein metal gallium and/or gallium nitride is used as the starting material for growth of a nitride crystal.

[26] The process for producing a nitride crystal according to [25], wherein the starting material for growth has an oxygen concentration of at most $1 \times 10^{18}$ atom/cm$^3$.

[27] The process for producing a nitride crystal according to any one of [1] to [26], wherein a seed crystal is put in the reactor before growing the crystal.

[28] The process for producing a nitride crystal according to any one of [1] to [27], wherein the ammonia is cooled while the reactant gas is introduced.

[29] A nitride crystal which is produced by the process as defined in any one of [1] to [28].

[30] A nitride crystal which has an oxygen concentration of at most $5 \times 10^{18}$ atom/cm$^3$ and a radius of curvature of a crystal lattice plane of a principal surface of at least 50 m.

[31] A nitride crystal which has an oxygen concentration of at most $5 \times 10^{18}$ atom/cm$^3$ and a silicon concentration of at most $5 \times 10^{18}$ atom/cm$^3$.

[32] The nitride crystal according to [30] or [31], wherein the nitride is gallium nitride.

[33] An apparatus for producing a nitride crystal, comprising a reactor in which a nitride crystal can be grown by ammonothermal method in the presence of ammonia, and a means to introduce a reactant gas reactive with ammonia to form a mineralizer into the reactor.

[34] The apparatus for producing a nitride crystal according to [33], wherein the means to introduce a reactant gas into the reactor is provided with a filter through which the reactant gas is passed.

[35] The apparatus for producing a nitride crystal according to [33], which further has a means to introduce an ammonia gas into the reactor.

[36] The apparatus for producing a nitride crystal according to [35], wherein the means to introduce an ammonia gas into the reactor is provided with a filter through which the ammonia gas is passed.

[37] The apparatus for producing a nitride crystal according to any one of [33] to [36], which further has a tube connected to the reactor, and a heater to heat at least a part of the tube.

Advantageous Effects of Invention

According to the process for producing a nitride crystal (hereinafter referred to as the ammonothermal method of the present invention), a highly pure nitride crystal having a low oxygen concentration can be grown efficiently. The nitride crystal of the present invention has a low oxygen concentration and a high purity, and thus coloration is hardly likely to result. Further, by using the production apparatus of the present invention, a nitride crystal having such characteristics can be produced efficiently.

DESCRIPTION OF EMBODIMENTS

Figure 1:
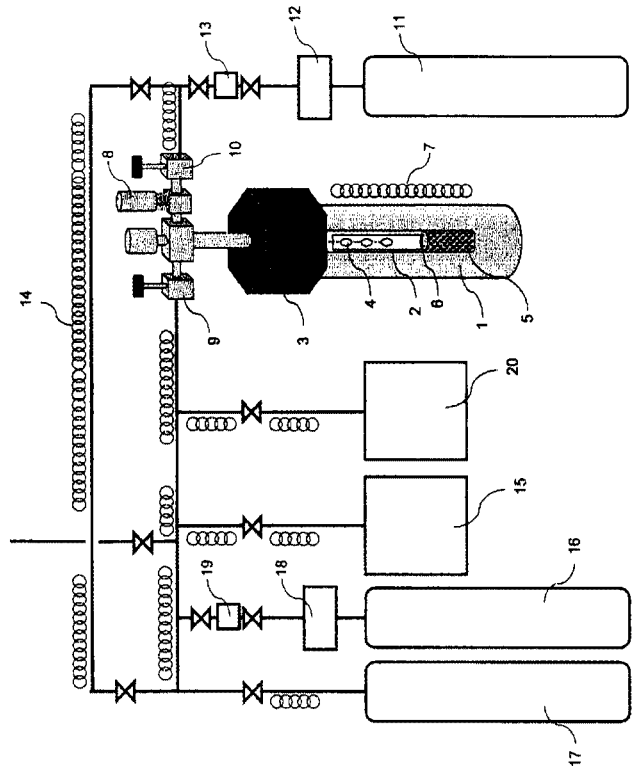
FIG. 1 is a schematic diagram illustrating an apparatus for producing a crystal used in the present invention.

Hereinafter, the process for producing a nitride crystal by an ammonothermal method, the nitride crystal and the apparatus for its production of the present invention will be described in detail. Some constituent features described below are based on representative embodiments of the present invention, but the present invention is not limited to these embodiments.

Further, in the present invention, an ammonothermal method is a method to produce a desired material by using an ammonia solvent in a supercritical state and/or a subcritical state and utilizing the dissolution-precipitation reaction of a starting material.

(Reactant Gas)

The ammonothermal method of the present invention is characterized in that a reactant gas reactive with ammonia to form a mineralizer, and ammonia into contact with each other to prepare a mineralizer, and then a nitride crystal is grown in the presence of the ammonia and the mineralizer.

The reactant gas used in the present invention may, for example, be a hydrogen halide gas such as a hydrogen fluoride gas, a hydrogen chloride gas, a hydrogen bromide gas or a hydrogen iodide gas. Among such reactant gases, it is more preferred to use a hydrogen chloride gas, a hydrogen bromide gas or a hydrogen iodide gas, and it is further preferred to use a hydrogen chloride gas because a gas having a higher purity than the other reactant gases is available. Such a reactant gas may be used as a liquid if it is a liquid depending on the condition of temperature and pressure, or it may be used in the form of gas by controlling the temperature and the pressure. Further, one of these reactant gases may be singly used, or two or more of them may be used in combination.

When using the reactant gas in the present invention, it is preferred to select and use a reactant gas having a low water content. The reactant gas preferably has a water content of, by weight, at most 10 ppm, more preferably at most 5 ppm, further preferably at most 1 ppm, and it is most preferred that the reactant gas contains no water. When a reactant gas having a water content of at most 10 ppm by weight, there is an advantage such that a nitride crystal having a lower oxygen concentration is likely to be obtained.

The reactant gas preferably has an oxygen content of, by weight, at most 10 ppm, more preferably at most 5 ppm, further preferably at most 1 ppm, and it is most preferred that the reactant gas contains no oxygen. When a reactant gas having an oxygen content of at most 10 ppm is used, a nitride crystal having a lower oxygen concentration is likely to be obtained.

The purity of the reactant gas used in the present invention is preferably at least 99.9%, more preferably at least 99.99%, further preferably at least 99.999%.

The reactant gas is preferably passed through a filter before it is brought into contact with ammonia in the ammonothermal method of the present invention. The reactant gas is passed through a filter, whereby impurities such as water incorporated in the reactant gas or impurities present in a gas cylinder of the reactant gas or in tubes may be removed. The type of the filter used in the present invention may, for example, be Nanochem Metal-X manufactured by Matheson Tri Gas. When the reactant gas is passed through the filter, the water amount in the reactant gas can be suppressed to at most 200 ppb.

(Contact Between Reactant Gas and Ammonia)

In the ammonothermal method of the present invention, the manner of bringing the reactant gas into contact with ammonia is not particularly limited. For example, the reactant gas can be contacted with ammonia by introducing the reactant gas into a reactor containing ammonia. In such a case, the reactant gas may be introduced through an orifice which the reactor is provided with, or the reactant gas may be directly introduced into ammonia liquid through an introduction tube extended into the ammonia liquid.

The contact between the reactant gas and ammonia is not necessarily carried out in a reactor, and it may be carried out in a closed circuit connected to a reactor. The closed circuit means a flow path or a container which forms a hermetically closed state with a reactor when it is connected to the reactor and which is isolated from the external air and is capable of preventing impurities such as oxygen and water from being incorporated. Further, the closed circuit is not necessarily consistently connected to a reactor, and it may have a structure such that it is separable from the reactor while it holds a function to form a hermetically closed state with the reactor by using devices such as a valve. An example of such a connection between a closed circuit and a reactor may be a structure having a reactor and another container (in this context it will be referred to as mixing container) connected to each other by a tube, and each of the reactor and the container is provided with a valve to make the structure capable of being hermetically closed.

When such a structure is employed, e.g. a process which comprises filling the reactor and the mixing container with ammonia; introducing the reactant gas into the mixing container to prepare a mineralizer; and opening the valve to introduce the ammonia containing the mineralizer into the connected reactor through the tube, may be carried out.

Further, for example, the both members may also be brought into contact with each other in the tube. When they are brought into contact with each other in the tube, if the mineralizer to be prepared is in the form of powder, the tube may possibly be clogged and blocked. In such a case, the diameter of the tube, the flow rate of the reactant gas, the temperature condition for the reactant gas supply, and so on may be properly controlled so that the tube will not be blocked with the prepared mineralizer, to find out the optimal condition.

In the case where a gas is supplied through a tube extended into ammonia liquid, since the tube remains in the reactor during the crystal growth, the tube is preferably made of a material having an excellent corrosion resistance to supercritical ammonia in which the mineralizer is present. Specifically, the tube is preferably made of an alloy composed of at least one member selected from Pt, Ir, W, Ta, Rh, Ru and Re.

The melting point of ammonia is −78° C., and the boiling point is −33° C. (both under atmospheric pressure and rounded off to the closest whole number). That is, ammonia is present as a liquid within a range between −78° C. and −33°

C., and thus the reactant gas reacts with liquid ammonia mainly at the gas-liquid interface.

The case where the reactant gas is hydrogen chloride is as follows. Hydrogen chloride has a melting point of −144° C. and a boiling point of −85° C. Accordingly the temperature range within which ammonia is present as a liquid is higher than the boiling point of hydrogen chloride, and thus hydrogen chloride is supplied as a gas. In this case, the reaction occurs at the gas-liquid interface as described above.

In the case where the reactant gas is hydrogen bromide, hydrogen bromide has a melting point of −87° C. and a boiling point of −66° C., and thus the reaction is a gas-liquid reaction of liquid ammonia and a hydrogen bromide gas between −66° C. and −33° C., and the reaction is a liquid-liquid reaction of liquid ammonia and liquid hydrogen bromide between −78° C. and −66° C. Between −87° C. and −78° C., solid ammonia is to be brought into contact with liquid hydrogen bromide. In this case, the reactivity is low, and thus it is preferred that after a prescribed amount of hydrogen bromide is introduced into the reactor, the temperature is raised to the melting point of ammonia or higher to promote the reaction.

In the case where the reactant gas is hydrogen iodide, hydrogen iodide has a melting point of −51° C. and a boiling point of −35° C., and thus the reaction is a reaction of liquid ammonia with a hydrogen iodide gas at a gas-liquid interface between −35° C. and −33° C. However, in this case, since the temperature range is close to the boiling point of ammonia, the temperature may possibly exceed the boiling point by the heat of reaction, and accordingly ammonia may possibly begin to vaporize. Between −51° C. and −35° C., since both ammonia and hydrogen iodide are present as liquid, the reaction is a liquid-liquid reaction. Between −78° C. and −51° C., the reaction is a liquid-solid reaction of liquid ammonia with solid hydrogen iodide. In this case, since the reactivity is low, it is preferred that after a prescribed amount of hydrogen iodide is introduced, the temperature is raised so that the temperature becomes the melting point of hydrogen iodide or higher to promote the reaction.

The preferred temperature ranges of the tube and the reactor at the time of supplying the reactant gas are as follows.

Regarding the temperature range of the tube, the introduction temperature of the reactant gas is not particularly limited as long as it is at most the boiling point of ammonia, but it is preferred to set the temperature of the tube for the reactant gas to be at least its melting point in order to prevent the reactant gas from becoming solid in the tube, and it is more preferred to set the temperature to be at least the boiling point of the reactant gas because it becomes possible to introduce the reactant gas as a gas. The upper limit is preferably about 400° C. because at a higher temperature, damages of the tube and the valve due to the temperature will be large.

Even if the temperature range in the reactor is the melting point of the reactant gas or lower, it does not prevent the introduction of a gas. However, in order to promote the reaction of ammonia with the reactant gas, after the introduction of the reactant gas, the temperature in the reactor is preferably set to be a temperature exceeding the melting points of both of ammonia and the reactant gas. The upper limit is preferably −33° C., which is the boiling point of ammonia, in order to introduce the gas efficiently.

The supply amount and the supply rate of the reactant gas to ammonia may be properly determined according to the environmental condition. Usually, it is preferred that the supply rate of the reactant gas is controlled so that the supplied reactant gas is successively reacted with ammonia.

The internal pressure in the reactor at the time of bringing the reactant gas and ammonia into contact with each other is preferably controlled to be lower than the pressure of the gas provided from the reactant gas cylinder. The pressure is preferably set to be within the range of from 0.01 to 0.5 MPa, more preferably within the range of from 0.01 to 0.2 MPa, further preferably within the range of from 0.01 to 0.1 MPa.

In a case where the internal pressure changes by an increase of the internal temperature due to the heat of reaction of ammonia with the reactant gas, it is preferred to remove the heat of reaction sufficiently by using e.g. a coolant. Further, it is preferred to monitor the gas pressure and to control the supply amount of the reactant gas while the heat of reaction is removed, to introduce the prescribed amount of the reactant gas into the reactor.

In such a case, it is preferred to remove the heat of reaction successively to adjust the temperature to be at most −33° C., which is the boiling point of ammonia. Strictly speaking, it is preferred to control the supply amount of the reactant gas and to supply it while monitoring the internal pressure so that the vapor pressure will not become higher than the introduction pressure of the reactant gas even when the temperature is the boiling point of ammonia or lower. In order to monitor the generation of the heat of reaction, the temperature change due to the heat of reaction may be measured by a thermocouple inserted into the inside of the reactor. Alternatively, the temperature of the outer wall of the reactor may be measured without measuring the internal temperature of the reactor directly. In this case, the correlation between the temperature in the reactor and the temperature of the outer wall of the reactor is preliminarily obtained in order to know the internal temperature of the reactor by measuring the temperature of the outer wall of the reactor.

The cooling method may, for example, be a method using a refrigerant or a method using cold air. The refrigerant may, for example, be dry ice-methanol, and the reactor may be cooled to about −60° C. to −70° C. by immersing the reactor in dry ice-methanol. If more cooling is needed, e.g. liquid nitrogen may be used in combination to adjust the temperature.

In the case where a hydrogen halide gas is selected as the reactant gas, the hydrogen halide gas and ammonia are brought into contact with each other, whereby an ammonium halide is formed. For example, when a hydrogen chloride gas is selected as the reactant gas, a hydrogen chloride gas and ammonia are brought into contact with each other, whereby ammonium chloride is formed. The ammonium halide such as ammonium chloride which is formed as described above functions as a mineralizer (acidic mineralizer). When hydrogen bromide gas is selected, ammonium bromide is formed, and when hydrogen iodide gas is selected, ammonium iodide is formed, and they respectively function as mineralizers. When a plurality of hydrogen halide gases are selected, a plurality of ammonium halides are formed and function as mineralizers.

Such an ammonium halide formed by contact between ammonia and the reactant gas is a powdery solid, and it is expected that in some cases, the reactant gas rapidly reacts with ammonia when introduced to block the tube for the reactant gas introduction. Thus, it has been recognized that it is difficult to prepare and introduce a mineralizer by such a method. However, the present inventors have succeeded in introducing the reactant gas without causing block of the tube by properly optimizing the reaction temperature and the supply rate of the reactant gas, and have accomplished the present invention.

As a condition for such a situation, for example, the reaction temperature is preferably set to be −196 to −33° C., more preferably from −196 to −60° C. The supply rate of the reactant gas is preferably set to be from 0.01 to 5 L/min, more preferably from 0.02 to 2 L/min. Further, it is preferred to supply the reactant gas so that the supply pressure of the reactant gas is constantly maintained higher than the vapor pressure of ammonia in order to prevent ammonia from flowing adversely in the tube during introduction of the reactant gas. In the present invention, the condition is not limited to the conditions described above, and an optimal condition may be suitably selected.

(Reactant Gas Formation Using Material Gases)

In the above section (Contact Between Reactant Gas and Ammonia), an example wherein the reactant gas is brought into contact with ammonia to form a mineralizer is described, but in the present invention, the gas to be supplied is not limited to the reactant gas, and a plurality of material gases which are materials for the reactant gas may be supplied. Such a plurality of material gases contact and react with each other to form a reactant gas, and such a reactant gas formed as above reacts with ammonia to form a mineralizer.

As the material gases, two or more types of gases which are reactive with each other are used. The gases which react with each other may be respectively called a first material gas and a second material gas, and it is possible to select a halogen as the first material gas and a gas reactive with a halogen to form a reactant gas as the second material gas. Such a second material gas may, for example, be a gas of at least one member selected from the group consisting of an alkane and a halogenated alkane having a hydrogen atom. Specifically, it may, for example, be a gas of at least one member selected from the group consisting of methane, monochloromethane, dichloromethane and trichloromethane. The halogen atoms forming the first material gas and the halogen atom forming the second material gas may be the same or different from each other. The case where the halogen atoms are the same is preferred. As the halogen, fluoride, chloride, bromide or iodide may be mentioned. Among them, chloride is preferably adapted because its highly pure gas is available.

As to the material gases used in the present invention, it is preferred to select and use ones having low water contents, as the above reactant gas. Further, it is preferred to select and use ones which have low impurity contents and which is highly pure. Preferred ranges of the water content, the impurity content and the purity of each material gas are the same as the preferred ranges of the water content, the impurity content and the purity of the above reactant gas. When such material gases having water contents, impurity contents and purities within the preferred ranges are used, there is an advantage that a nitrogen crystal having a lower oxygen concentration is likely to be obtained. Further, it is preferred to have the material gases passed through filters before they are brought into contact with ammonia. Specifically, the usable filters may, for example, be Nanochem OMX manufactured by Matheson Tri Gas for an alkane, and the above filter used for hydrogen halide, for a halogen gas.

In the ammonothermal method of the present invention, the manner of supplying the material gases to ammonia is not particularly limited as long as the reactant gas formed from the material gases can contact with ammonia in a reactor or in a closed circuit connected to a reactor. Therefore, the plurality of material gases may be respectively introduced into a reactor containing ammonia through different orifices with which the reactor is provided so that the plurality of material gases and ammonia will be mixed in the reactor, or the plurality of material gases may be preliminarily brought into contact with each other to form a reactant gas, and then the mixed gas containing the reactant gas may be introduced into the reactor containing ammonia. In the latter case, the reactant gas may be formed from the plurality of material gases in another reactor and introduced into the reactor containing ammonia, or a reactant gas may be formed by mixing the plurality of material gases in a tube and introduced into the reactor containing ammonia. Further, the reaction between the formed reactant gas and ammonia is not necessarily carried out in a reactor, and it may be carried out in a tube. Further, in a container other than the reactor, for mixing ammonia and the reactant gas, ammonia and the reactant gas may be reacted with each other in this mixing container to prepare a mineralizer and then introduced to the reactor. In such a case, it is required that the mixing container and the reactor are connected to form a closed circuit. That is, it is required that the mineralizer prepared in the mixing container is isolated from the outer air and is able to be supplied to the reactor without incorporating impurities such as oxygen and water.

Among these various embodiments, it is preferred that the plurality of material gases are preliminary brought into contact with each other to form a reactant gas, and then the reactant gas is introduced into the reactor containing ammonia.

(Crystal Growth)

The mineralizer prepared according to the process of the present invention is used for the growth of a nitride crystal. That is, a nitride crystal is grown in the presence of the mineralizer and ammonia. Ammonia used for the crystal growth is preferably ammonia used for preparation of the mineralizer. Therefore, it is most preferred to use an ammonia solution containing the prepared mineralizer for the crystal growth. The ammonia solution containing the mineralizer may be introduced into the reactor in which a nitride crystal will be grown from the closed circuit connected to the reactor, or a nitride crystal may be grown in the reactor in which the mineralizer is prepared, as it is. In the latter case, the reactor is required to satisfy the conditions for growth of a nitride crystal, and it is required to select and use one having a structure suitable for the crystal growth. Further, in the latter case, the time of the step of preparing the mineralizer may overlap with the time of the step of the nitride crystal growth. That is, while the mineralizer is prepared, a nitride crystal may be grown at the same time.

As to the growth condition for a nitride crystal, the growth condition for a nitride crystal in the usual ammonothermal method may be suitably selected and adapted.

As to the starting material for growth of a crystal, the starting material usually used for the growth of a nitride crystal by an ammonothermal method may be suitably selected and used. For example, in the case of growing a gallium nitride crystal, metal gallium, gallium nitride or a mixture thereof may be used as a material of a gallium source. The starting material for growth of a crystal used in the present invention preferably has an oxygen concentration of at most $1 \times 10^{18}$ atom/cm$^3$, preferably at most $1 \times 10^{17}$ atom/cm$^3$, more preferably $1 \times 10^{16}$ atom/cm$^3$.

(Seed Crystal)

When a seed crystal is preliminary permitted to be present, it is also possible to grow a nitride crystal having a desired crystal structure and growth surface. For example, when a hexagonal gallium nitride crystal is used as a seed crystal, a hexagonal gallium nitride crystal may be grown efficiently. As a seed crystal, a plate crystal in the shape of a thin plate is usually used, but the crystal orientation of the principal surface can be optionally selected. The principal surface means the largest surface of a seed crystal in the form of a thin plate.

In the case of a hexagonal gallium nitride single crystal, seed crystals having the principal surfaces in various orientations such as a polar surface represented by the (0001) surface or the (000-1) surface, a semipolar surface represented by the (10-12) surface or the (10-1-2) surface, and a nonpolar surface represented by the (10-10) surface are used, whereby it is possible to grow crystals in arbitrary orientations. The orientation in cutting out a seed crystal is not limited to a facet surface described above, and a surface displaced by an arbitrary angle from a facet surface may also be selected.

The growth temperature of the nitride crystal in the present invention is usually preferably set to be from 300 to 700° C., more preferably from 350 to 650° C., further preferably from 400 to 600° C. The pressure during the growth of the nitride crystal in the present invention is usually preferably set to be from 80 to 300 MPa, more preferably from 100 to 250 MPa, further preferably from 120 to 250 MPa. As to other growth conditions for the nitride crystal, the sections of manufacturing conditions and of seed crystals in JP-A-2007-238347 may be the reference for such conditions.

(Additional Steps)

In the ammonothermal method of the present invention, additional steps may be added to the above steps. For example, it is preferred that after a required starting material for crystal growth and a seed crystal are put into the reactor and before ammonia and the reactant gas or the material gases are introduced into the reactor or the closed circuit connected to a reactor, a step of replacing the interior of the reactor and the tube with a nitrogen gas (nitrogen replacement step) may be preferably added. Further, at the same time, it is preferred to add a step of reducing the pressure in the reactor and the tube (pressure reduction step) may be added. In such a case, the pressure is preferably reduced to within a range of from $10^{-7}$ to 10 Torr, more preferably within a range of from $10^{-7}$ to 1 Torr, further preferably within a range of from $10^{-7}$ to $10^{-3}$ Torr. It is preferred that the pressure reduction is continued until the pressure reaches the above range. Further, at the same time as the nitrogen replacement, it is preferred to add a step of heating the interior of the reactor and the tube (heating step) may also preferably be added. The heating temperature may be set within a broad range as long as volatile materials adsorbed or attached to the inside of the reactor and the tube can be removed, and taking the combination with the nitrogen replacement and the pressure reduction into consideration, the heating temperature is preferably within a range of from 70 to 400° C., more preferably within a range of from 80 to 300° C., further preferably within a range of from 100 to 250° C. If the temperature is too low, the effect to sufficiently remove volatile materials would be low, and if the temperature if too high, although the effect to remove volatile materials is high, damages to the tube and the valve due to the temperature would become large. Heating time is not particularly limited, but it is preferred that the heating and pressure reduction steps are continued until the pressure becomes within the above pressure range in order to confirm the effect of heating under reduced pressure, etc.

When the above nitrogen replacement step, pressure reduction step and heating step are carried out, it becomes possible to grow a nitride crystal having a lower oxygen concentration. As to these steps, it is preferred to carry out at least one step of them, more preferred to carry out the nitrogen replacement step in combination with the pressure reduction step or the heating step, further preferred to carry out all the three steps. Further, the three steps may be repeatedly carried out. When the three steps are repeatedly carried out, it is possible to remove more attached or adsorbed materials. By the three steps, it is possible to effectively remove volatile materials attached or adsorbed to the inside of the tube, the inside of the reactor and the members (a seed crystal, a starting material and structural members) input in the reactor. Particularly, the effect to remove water, among the volatile materials, is high. When a highly pure reactant gas is used and the three steps are carried out in combination, it is possible to grow a nitride crystal having a higher purity and a lower oxygen concentration. Among the three steps, the combination of the pressure reduction step and the heating step, actually, has not been able to be carried out in the conventional ammonothermal method wherein a solid mineralizer is added because the mineralizer is vaporized. For example, in the case where solid ammonium chloride is used as the mineralizer and the heating step is applied, the step of removing water by pressure reduction cannot be applied because of the vaporization of ammonium chloride, and further, since ammonium chloride is reduced due to the vaporization, a desired mineralization concentration cannot be obtained. Although the sublimation temperature of ammonium chloride is 338° C. at 0.1 MPa, the vaporization actually begins at much lower temperature because of the presence of the vapor pressure. The vapor pressure of ammonium chloride at 150° C. is about 70 Pa. When attempting to reduce pressure at the same time as the heating, ammonium chloride is rapidly evaporated because it has a much higher vapor pressure, and thus it has been impossible to apply the heating and pressure reduction step in the conventional ammonothermal method.

In a case where the mineralizer is prepared outside the reactor in which a nitride crystal will be grown and an ammonia solution containing the mineralizer is introduced into the reactor at the time of the crystal growth, only the interior of the reactor for crystal growth may be subjected to nitrogen replacement, pressure reduction and heating after the ammonia solution containing the mineralizer is prepared. In such a case, the nitrogen replacement, the pressure reduction and the heating of the interior of the reactor may be carried out in accordance with the above steps of nitrogen replacement, pressure reduction and heating.

The process of a representative crystal growth in the present invention is as follows. First, a required starting material for crystal growth, a seed crystal, etc. are put into a reactor which is sufficiently washed, and the lid is closed. Heating is carried out under ordinary pressure or reduced pressure to remove adsorption gases and volatile materials. Then, the interior of the reactor is replaced with a nitrogen gas, followed by being filled with ammonia. Next, a reactant gas or material gases are introduced to prepare a mineralizer, and the temperature is raised to grow a crystal. After the crystal is sufficiently grown, the temperature is lowered and the nitride crystal is recovered. Preferred ranges for respective materials and respective operations are as described above. According to this manner, it is possible to proceed the process in a completely closed system after the starting material for crystal growth and the seed crystal are put into the reactor, and thus volatile materials, etc. can be removed by the heating step etc., and further it is possible to prevent external water and impurities from being incorporated. Therefore, there is an advantage that a more highly pure nitride crystal is likely to be obtained. Further, according to the present invention, the nitride crystal can be grown at a higher growth rate than the conventional method.

A more detailed example of the embodiments will be hereinafter described. First, the interior of the reactor is sufficiently washed and dried. In the same manner, members which will be placed in the reactor such as a seed crystal, a starting material, a frame for fixing the seed crystal, a baffle plate, a cage for the starting material, and so on are sufficiently washed and dried. These members are placed in prescribed positions in the reactor, and the reactor is hermetically closed. Next, a vacuum pump is connected to a valve with which the reactor is provided, and the pressure is reduced to about $10^{-3}$ Torr, followed by replacement of the interior with a highly pure and sufficiently dried nitrogen. Then, the pressure is reduced by a vacuum pump to about $10^{-3}$ Torr again. This operation is repeated for several times, and then the tube and the reactor is heated to 100 to 250° C. by a heater. As the heater, for example, a ribbon heater or a silicone rubber heater, which can be wrapped around the tube and the reactor, may be used. During the heating step, the pressure reduction is continued by using the vacuum pump so that the pressure is adjusted to be from $10^{-7}$ to $10^{-3}$ Torr. After the pressure is sufficiently reduced, the heater is shut off to cool the reactor. For the cooling of the reactor, immersion in dry ice-methanol may be applied. Since a drastic temperature change may possibly cause distortions of the tube, the valve, the reactor, the seed crystal placed in the reactor, and so on, the cooling is preferably natural cooling or air cooling until the temperature becomes around room temperature. Then, a cooling using the above dry ice-methanol is carried out to a temperature of about −60 to −70° C. When the reactor is sufficiently cooled, the valve is closed to hermetically close the reactor, and the vacuum pump is shut off. Next, a valve for ammonia is opened to fill a prescribed amount of ammonia in the reactor. The filling amount of ammonia may be measured by a mass flow controller. It is preferred to suppress water content in ammonia to at most 1 ppb by having ammonia passed through an in-line filter. After a prescribed amount of ammonia is filled, the valve on the line for introducing ammonia is closed. Hereinafter, the case of introducing a hydrogen halide gas as the reactant gas will be described. Then, the valve on the line for introducing the hydrogen halide gas is opened to introduce the gas into the reactor. In the same manner as in the case of ammonia, a prescribed amount of the gas is measured by a mass flow controller and filled. An in-line filter is used, whereby the water content may be suppressed to at most 200 ppb. The hydrogen halide gas introduced into the reactor reacts with ammonia to form an ammonium halide, which is a mineralizer. By this reaction, the hydrogen halide gas is consumed, so that a negative pressure is generated, and thus the hydrogen halide gas can be continuously introduced into the reactor. The pressure in the reactor depends on the balance between the pressure decrease due to the formation of an ammonium halide and the pressure increase due to the generation of the heat of reaction. Since the temperature increase depends on the size of the reactor and the amount of ammonia, it is preferred to adjust the flow volume of the ammonium halide while monitoring the flow volume change of the mass flow controller and the pressure change, in the actual control. After a prescribed amount of the hydrogen halide is filled, the valve is closed and the reactor is separated from the line to complete the filling. In the case where the reactor is an autoclave, the reactor itself is set in a heating furnace, and the temperature, the pressure and the difference in temperature are controlled to be subscribed values to undergo crystal growth for an arbitrary period of time. In the case where the reactor is an inner cylindrical tube, the inner cylindrical tube is inserted in an autoclave and the autoclave is hermetically closed, and then the interior of the autoclave, i.e. the outside space of the inner cylindrical tube is filled with a prescribed amount of ammonia through a valve. The filling amount of ammonia is determined so that the pressure in the inner cylindrical tube will be almost the same as the pressure of the outside of the inner cylindrical tube during crystal growth. After a crystal is sufficiently grown, the temperature of the autoclave is lowered and the crystal is recovered. In a case where two or more types of materials gases instead of a reactant gas are introduced to form a reactant gas, the process is the same except that the above step of introducing a hydrogen halide gas is repeated for several times to introduce the material gases.

(Reactor)

The reactor used in the present invention is required to have enough resistance to the temperature and the pressure which are desirable to grow a nitride crystal efficiently and to have corrosion resistance against the materials used in the present invention and the reaction products. Therefore, the growth of a nitride crystal is preferably carried out in an autoclave or in an inner cylindrical tube inserted in an autoclave. Further, for the purpose of an excellent corrosion resistance, it is preferred to use a reactor lined with at least one metal or with an alloy of at least one metal, selected from the group consisting of Pt, Ir, W, Ta, Rh, Ru and Re. Among these metals, it is more preferred to use a reactor lined with at least one metal or with an alloy of at least one metal, selected from the group consisting of Pt, Ir, W and Ta, and it is further preferred to use a reactor lined with at least one metal or with an alloy of at least one metal, selected from the group consisting of Pt and Ir. The lining may be attached to the inner surface of the autoclave, or it may be an inner cylindrical tube which is separated from the autoclave.

A tube for introducing a gas is connected to each of the autoclave and the inner cylinder of the autoclave, and the tube is preferably provided with at least two valves. Further, the tube is preferred to be provided with a filter which is able to remove e.g. impurities contained in a gas. Further, the tube is preferred to be provided with a system capable of measuring the flow volume of a gas. Further, the tube is preferred to be provided with a system capable of measuring the pressure during the introduction of a gas. Further, the tube is also preferred to be provided with a system to heat or cool the autoclave or the inner cylinder in an autoclave. For more detail about the reactor, the section of crystal production apparatus in JP-A-2007-238347 may be a reference.

(Material for Tube)

If the step of removing water is carried out sufficiently, it is possible to suppress the corrosion by a hydrogen halide. However, since 100% corrosion prevention is difficult, the following materials and the inner surface finishing of the tube are preferred. As the material for the tube, a stainless steel such as SUS316 or SUS316L, or a nickel base alloy such as Hastelloy, Monel or Inconel may be used. As to the inner surface finishing, a smooth surface finishing is preferred for the purpose of suppressing the adsorption of water and improving the corrosion resistance. The inner surface is preferred to be subjected to BA (bright annealed) finish, more preferred to EP (electrolytic polish) finish. For the tube, a fluororesin such as polytetrafluoroethylene which is excellent in corrosion resistance, as well as a metal, may also be used. Or, a tube covered with a fluororesin may also be used.

(Nitrogen Replacement of Tube)

If a hydrogen halide gas contains no water, it has no corrosivity to metals, but if a slight amount of water is present in a hydrogen halide gas, it causes the members such as a gas cylinder, a tube and a connector to corrode severely. In order not to cause a corrosion, water is required to be removed at all portions which the hydrogen halide gas is to contact with (inner surface of the tube, the valve, and so on). In order to remove water, the pressure in the tube is reduced and the interior of the tube is replaced with a highly pure dry nitrogen. The step of pressure reduction and nitrogen replacement is repeated for several times to sufficiently remove water adsorbed in the reactor and the inner surface of the tube for a gas. Further, when the tube is heated while the pressure reduction, water may be removed more efficiently. As a specific method for removing water, the above section of (Addition Steps) may be referenced.

(Purity of Ammonia)

It is preferred to suppress the water content in ammonia to a low level, as well. The purity of ammonia is preferably at least 99.99%, more preferably at least 99.999%. The water content in ammonia is preferably at most 10 ppm, more preferably at most 5 ppm, further preferably at most 1 ppm. It is preferred to have ammonia passed through a filter in order to further decrease the water content. The filter to be used may, for example, be Nanochem OMA manufactured by Matheson Tri Gas. When ammonia is passed through a filter, the water content in ammonia can be suppressed to at most 1 ppb.

(Apparatus for Production of Nitride Crystal)

In the present invention, any one of apparatuses may be used as long as a nitride crystal may be produced by the apparatus by using the ammonothermal method according to the present invention.

Typically, the production apparatus of the present invention provided with a reactor in which a nitride crystal may be grown by an ammonothermal method and a means for introducing a reactant gas into the reactor is used. The means for introducing a reactant gas into the reactor may, for example, comprise a gas cylinder containing the reactant gas and a tube connecting the gas cylinder with the reactor. It is preferred that on the flow path of the tube, at least one valve is provided so that it is possible to switch the introduction of the reactant gas on and off. Further, it is preferred that on the flow path of the tube, a filter described in the above section (Purity of Ammonia) is provided as an in-line filter.

In a case where a plurality of material gases are reacted to form a reactant gas thereby to carry out the ammonothermal method of the present invention, gas cylinders of respective material gases and a tube for mixing gases introduced from the material gas cylinders and introducing the mixed gas to the reactor are needed. For example, in a case where a first material gas and a second material gas are mixed and introduced into the reactor, an apparatus wherein a tube from the gas cylinder of the first material gas and a tube from the gas cylinder of the second material gas are joined at a junction to make up one tube and the tube is connected to the reactor, may be used. In such a case, the first material gas and the second material gas react with each other while they flow from the junction to the reactor to form a reactant gas. Further, instead of joining the tubes, another apparatus may be used, wherein both the tube from the gas cylinder of the first material gas and the tube from the gas cylinder of the second material gas are introduced into a container other than the reactor, and another tube leading from the container to the reactor is additionally provided. In such a case, the first material gas and the second material gas react with each other in the container in which the two gases are mixed or react with each other while they flow from the container to the reactor, to form a reactant gas. Also in such a case where a plurality of material gases are used, it is preferred that the tubes from respective material gas cylinders are provided with a valve and a filter.

The production apparatus of the present invention is preferably provided with a means for introducing an ammonia gas into the reactor, separately from the means for introducing a reactant gas into the reactor. Such a means comprises, typically, an ammonia gas cylinder and a tube connecting the cylinder and the reactor. It is preferred that on the flow path of the tube, at least one valve and a filter are provided, as the above tube for a reactant gas cylinder. The tube introducing an ammonia gas and the tube introducing a reactant gas may be respectively connected to the reactor directly, but usually, it is preferred that these tubes are joined to make up one tube to be connected to the reactor.

Further, for the production apparatus of the present invention, a means which is employed for a production apparatus of a nitride crystal by a normal ammonothermal method may suitably be selected and employed. For example, a gas cylinder containing an inert gas such as nitrogen may be incorporated in the apparatus, as well as the above ammonia gas cylinder. Further, it is also possible to make the production apparatus so that the pressure in the reactor and the tube can be reduced by using a vacuum pump.

The production apparatus of the present invention is preferably provided with a heater to heat the tube, as described above. Since a heater was not necessary for a production apparatus of a nitride crystal by the conventional ammonothermal method, a heater was not specially used to heat a tube. However, since in the present invention, it is possible to heat before the crystal growth is started as described above and since more preferred crystal can be obtained by heating, it is particularly preferred that a heater to heat a tube is provided. Types of the heater are as described above.

FIG. 1 shows a preferred example of the production apparatus of the present invention. This production apparatus is provided with a reactor 1 in which a nitride crystal may be grown in the presence of ammonia by an ammonothermal method, a reactant gas cylinder 11 and a tube leading from this gas cylinder to the reactor 1. On the flow path of the tube, an in-line filter 12, a mass flow meter 13 and a plurality of valves including a valve 10 are provided. The reactor 1 is provided also with a tube which is capable of introducing an ammonia gas from an ammonia cylinder 16 through an in-line filter 18 and a mass flow meter 19, and on the flow path of the tube, a plurality of valves including a valve 9 are provided. Further, the reactor 1 is provided also with a tube which is capable of introducing a nitrogen gas from a nitrogen gas cylinder 17, and vacuum pumps 15 and 20. This production apparatus is provided with a heater 14 to heat the tubes. As to a specific use of the production apparatus shown in FIG. 1, Examples hereinafter described may be referenced.

(Nitride Crystal)

When a mineralizer prepared by reacting a reactant gas with ammonia is used according to the present invention, the oxygen concentration of the nitride crystal obtained by the crystal growth is significantly low as compared with the case where a solid mineralizer is added. The oxygen concentration of the nitride crystal obtained by the ammonothermal method of the present invention is usually at most $5 \times 10^{18}$ atom/cm$^3$, preferably at most $5 \times 10^{17}$ atom/cm$^3$, more preferably at most $1 \times 10^{17}$ atom/cm$^3$, further preferably at most $8 \times 10^{15}$ atom/cm$^3$. Such a low oxygen concentration is at a level which cannot be achieved by the conventional ammonothermal method wherein a solid mineralizer is added.

Further, the nitride crystal obtained by the ammonothermal method of present invention also has a characteristic such that the silicon concentration is low as compared with a nitride crystal obtained by the conventional ammonothermal method. The silicon concentration of the nitride crystal obtained by the ammonothermal method of the present invention is usually at most $5 \times 10^{18}$ atom/cm$^3$, preferably at most $1 \times 10^{18}$ atom/cm$^3$, more preferably at most $3 \times 10^{17}$ atom/cm$^3$.

Further, the nitride crystal obtained by the ammonothermal method of the present invention also has a characteristic such that the threading dislocation density is low. The threading dislocation density of the nitride crystal obtained by the ammonothermal method of the present invention is at most $1\times10^4/cm^2$, more preferably at most $1\times10^3/cm^2$, further preferably at most $1\times10^2/cm^2$.

Further, the nitride crystal obtained by the ammonothermal method of the present invention also has a characteristic such that the warpage of a lattice plane is small. The radius curvature of the crystal lattice plane parallel to the principal surface of the nitride crystal obtained by the ammonothermal method of the present invention is usually at least 10 m, preferably at least 50 m, more preferably at least 100 m.

The type of the nitride crystal obtained by the ammonothermal method of the present invention depends on the type of selected starting material for crystal growth, etc. According to the present invention, it is possible to preferably grow a Group III nitride crystal, more preferably a nitride crystal containing gallium. Specifically, the present invention is preferably applicable to the growth of a gallium nitride crystal.

According to the ammonothermal method of the present invention, a crystal having a relatively large size may also be obtained. For example, it is possible to obtain a nitride crystal having a greatest dimension of at least 50 mm, more preferably a nitride crystal having a greatest dimension of at least 76 mm, further preferably a nitride crystal having a greatest dimension of at least 100 mm. Since the crystal is grown in an environment where the amount of impurities is small as compared with the conventional method, it can be grown with a larger area of a surface and with more uniformity.

EXAMPLES

Now, the present invention will be described in detail with reference to Examples and Comparative Example. The materials, amounts, ratios, processes and procedures described in the following Examples may be suitably changed as long as it does not depart from the spirit of the present invention. Therefore, it should be understood that the present invention is by no means limited to these Examples.

Example 1

In this Example, a nitride crystal was grown by using the reactor shown in FIG. 1.

A crystal was grown by using, as a reactor, an autoclave 1 (inner volume: about 27 cm³) made of Inconel 625 lined with platinum, having inside dimension of a diameter of 15 mm and a height of 154 mm. The inner surface of the autoclave 1 was sufficiently washed and dried. In the same manner, a platinum wire, a platinum supporting frame for a seed crystal, a platinum baffle plate and a material cage made of a platinum mesh for a starting material are washed and dried. As the starting material for growth of a nitride crystal, polycrystalline gallium nitride particles were used. The polycrystalline gallium nitride particles were washed with a hydrofluoric acid having a concentration of about 50% in order to remove attached matters and rinsed with pure water followed by drying, and 13 g of the polycrystalline gallium nitride particles was measured and filled in the material cage made of a platinum mesh and was placed in the starting material area at the lower part of the autoclave as a starting material 5. The oxygen content in the polycrystalline gallium nitride as a starting material was $5\times10^{17}$ atoms/cm³, as a result of an analysis by SIMS (Secondary Ion Mass Spectrometer). Next, a baffle plate 6 made of platinum (aperture ratio: 10%) was placed at almost the midpoint between the growing area and the starting material area. Further, 4 pieces of a hexagonal crystalline gallium nitride single crystal (10 mm×10 mm×0.3 mm) were, as seed crystals 4, hanged from the platinum supporting frame for a seed crystal by using a platinum wire having a diameter of 0.2 mm to be placed in the growing area at the upper part of the autoclave.

Then, an autoclave lid 3 equipped with valves 9 and 10 is closed to hermetically close the autoclave 1. Next, handling was carried out so that the flow path leads to a rotary pump 15 via the valves 9 and 10 attached to the autoclave, and the valves 9 and 10 were opened for vacuum deaeration until the pressure reaches about $10^{-3}$ Torr. Then, a highly pure dry nitrogen was filled from a nitrogen cylinder 17. This operation from the vacuum deaeration to the nitrogen replacement was repeated for 3 times, followed by further vacuum deaeration. While the vacuum state was maintained, the tube was heated by a ribbon heater 14 to about 100° C. The main body of the autoclave was heated by a silicon rubber heater 7 to about 200° C. While heating was maintained, the operation of a turbomolecular pump 20 was continued until the pressure reaches a high vacuum of about $10^{-7}$ Torr. The pressure was maintained at about $10^{-7}$ Torr for 3 hours, and then the heater was shut off and the temperature was lowered close to room temperature by natural cooling and air blow, followed by immersion in dry ice-methanol to cool the autoclave to −60 to −70° C. Then, the valves 9 and 10 were closed to stop the turbomolecular pump 20.

Then, the switch of a mass flow controller 19 was turned on to fill a highly pure ammonia (purity: 99.999%) having the water content suppressed to at most 1 ppb from an ammonia cylinder 16 through an in-line filter 18 (Nanochem OMA manufactured by Matheson Tri Gas), and the valve 9 was opened. 17.5 Liters of ammonia was filled at a flow rate of 2 liters per minute based on the flow control, and then, when the line automatically stopped to stop the filling, the valve 9 was closed. Then, a hydrogen chloride gas (purity: 99.999%) as a reactant gas was filled. A mass flow controller 13 was turned on and a valve 10 was opened, and then 0.35 liter of the hydrogen chloride gas having the water content suppressed to at most 200 ppb was filled at a flow rate of 0.05 liter per minute, from a reactant gas cylinder 11 through an in-line filter 12 (Nanochem Metal-X manufactured by Matheson Tri Gas). During the filling, the pressure increase in the autoclave 1 was not observed, and it was suggested that the filled hydrogen chloride gas was successively reacted with ammonia to form ammonium chloride. By monitoring the temperature of the outer wall by a thermocouple, the temperature fluctuation was ±0.2° C., and the influence due to the temperature increase by a heat of reaction was not detected. After completion of the filling of a prescribed amount, when the line automatically closed, the valve 10 was closed. Then, a part of the line of hydrogen chloride was replaced with a nitrogen gas and was cut off from the line.

Then, the autoclave 1 was placed in an electric furnace composed of a heater halved into an upper and a lower portions. The temperature was raised over a period of 12 hours, and the outer wall temperature of the autoclave was set so that the temperature of the solution at the lower part of the autoclave would be 550° C. and the temperature of the solution at the upper part would be 420° C., followed by maintaining the temperature for further 240 hours. The correlation equation between the outer wall temperature of the autoclave and the temperature of the solution in the autoclave had been preliminarily prepared by an actual measurement. The pressure in the autoclave 1 was about 130 MPa. The variability of the controlled temperature while maintained was within ±5° C.

After completion of the growth term, the temperature was lowered by using a program controller in about 8 hours, until the outside temperature of the lower part of the autoclave 1 became 150° C., and then heating by a heater was stopped and the autoclave 1 was naturally cooled in the electric furnace. After it was confirmed that the outside temperature of the lower part of the autoclave 1 was lowered to almost room temperature, first, the valve 9 which the autoclave was provided with was opened to remove ammonia in the autoclave 1. Next, ammonia in the autoclave 1 was completely removed by a vacuum pump. Then, the autoclave lid 3 was opened and the supporting frame for a seed crystal, the baffle plate and the starting material cage were recovered from the autoclave. A white powdery substance was attached to the upper portion of the inner wall of the autoclave.

The weight of the seed crystal after growth is measured and compared with the weight before the growth, whereby it is confirmed that the weight is increased. Further, X-ray diffraction measurement is carried out, whereby it is confirmed that the precipitated crystal is hexagonal gallium nitride. Further, an analysis of the precipitated crystal by SIMS is carried out, whereby it is confirmed that the oxygen content and the silicon content in the crystal are low. Further, it is confirmed that the precipitated crystal has little color and high transparency as compared with the crystal grown by the conventional ammonothermal method. The white powder attached to the inner wall is identified by powdery X-ray diffraction and is found to be an ammonium chloride crystal. This confirms that hydrogen chloride introduced as a gas forms ammonium chloride in the autoclave and functions as a mineralizer.

Example 2

In this Example, a nitride crystal was grown in the same manner as in Example 1 except for the size of the autoclave. Since the volume of the autoclave is different, the filling amount of ammonia and the filling amount of the hydrogen chloride gas were changed based on the volume ratio, so that the conditions became the same as in Example 1.

In Example 2, crystal growth was carried out by using an autoclave (inner volume: about 110 cm$^3$) having inside dimensions of a diameter of 22 mm and a height of 290 mm as a reactor.

The weight of the seed crystal after growth was measured and compared to the weight before growth, whereby it was confirmed that the weight was increased. Further, X-ray diffraction measurement was performed, whereby it was confirmed that the precipitated crystal was hexagonal gallium nitride. The precipitated crystal had little color and high transparency as compared with a crystal grown by the conventional ammonothermal method.

As a result of SIMS measurement of the gallium nitride crystal grown on the seed crystal, up to $5.0 \times 10^{17}$ atom/cm$^3$ of oxygen was detected. At another measurement position, the oxygen concentration was below detection limit. Further, $3.0 \times 10^{17}$ atom/cm$^3$ of silicon was detected. As the measurement apparatus, Secondary Ion Mass Spectrometer model 4F manufactured by Cameca was used. Cs$^+$ ions were used as primary ions, and the primary ion energy was set to be 14.5 keV. The detection limits under these conditions are $8 \times 10^{15}$ atom/cm$^3$ for oxygen and $1 \times 10^{15}$ atom/cm$^3$ for silicon. The white powder attached to the inner wall was identified by powder X-ray diffraction, whereby it was confirmed to be an ammonium chloride crystal.

This supports that hydrogen chloride introduced as a gas formed ammonium chloride internally and functioned as a mineralizer.

Comparative Example

Figure 2:
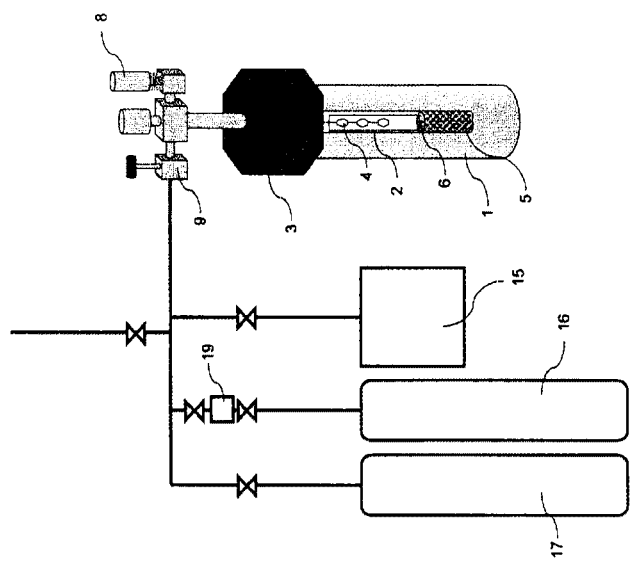
FIG. 2 is a schematic diagram illustrating an apparatus for producing a crystal used in Comparative Example.

In this Comparative Example, the reaction apparatus shown in FIG. 2 was used to grow a nitride crystal.

A gallium nitride crystal was grown in the same manner as in Example 1 except that the following conditions in Example 1 were changed. Instead of introducing a hydrogen chloride gas, 0.75 g of an ammonium chloride reagent was charged. Ammonium chloride put in a starting material cage made of a platinum mesh along with a polycrystalline gallium nitride starting material was charged into the autoclave 1 and the autoclave was hermetically closed. In the steps where the autoclave lid 3 was not hermetically closed, all operations were carried out in a nitrogen atmosphere. After the autoclave was hermetically closed, the pressure was reduced by a rotary pump 15. However, since a heating step could not be carried out because of the presence of the ammonium chloride reagent as a mineralizer, the pressure reduction step was carried out at room temperature. Then, the autoclave was cooled in dry ice-methanol, and a valve 9 was closed. Next, ammonia was filled in the autoclave 1 from an ammonia cylinder 17, in the same manner as in Example 1. Successive steps were the same as in Example 1. The pressure when the temperature was raised to the same temperature was 132 MPa.

The weight of the seed crystals recovered after the operation completion was measured, and as a result, an increase by 0.26 g was confirmed. The precipitated crystal was analyzed, and as a result, the crystal was confirmed to be a hexagonal gallium nitride, which was the same as in Example 1. As compared with Example 1 and Example 2, black to brown coloration was significant. The result of oxygen concentration analysis by SIMS was $5 \times 10^{19}$ atom/cm$^3$. The result of silicon concentration analysis was $4 \times 10^{19}$ atom/cm$^3$.

Industrial Applicability

According to the process for producing a nitride crystal by the ammonothermal method of the present invention, a nitride crystal having a low oxygen concentration and high purity may be grown efficiently. Further, the apparatus of the present invention which is capable of producing such a nitride crystal can be made larger for the purpose of high-volume production, and thus the industrial applicability is high. Further, since the nitride crystal of the present invention has a low oxygen concentration and high purity, it is less likely to be colored, and thus it may be applied to various use including substrates for opto-electronics such as LEDs and LDs. Therefore, the present invention has a high industrial applicability.

The entire disclosures of Japanese Patent Application No. 2009-002189 filed on Jan. 8, 2009 and Japanese Patent Application No. 2009-195856 filed on Aug. 26, 2009 including specifications, claims, drawings and summaries are incorporated herein by reference in their entireties.

REFERENCE SYMBOLS

1: autoclave (reactor)
2: lining
3: autoclave lid
4: seed crystal
5: starting material
6: baffle plate
7: heater
8: pressure sensor
9: valve
10: valve
11: reactant gas cylinder
12: in-line filter
13: mass flow meter
14: heater
15: vacuum pump 1 (rotary pump)
16: ammonia cylinder 17: nitrogen cylinder
18: in-line filter
19: mass flow meter
20: vacuum pump 2 (turbomolecular pump)

The invention claimed is:

1. A process for producing a nitride crystal, comprising:
   introducing (a) a reactant gas, which is reactive with ammonia to form a mineralizer, into a reactor charged with (b) ammonia, to produce a mineralizer in the reactor,
   wherein the ammonia is cooled while the reactant gas is introduced into the reactor; and
   in the same reactor in which the mineralizer is produced, growing a nitride crystal from a starting material suitable for growth of a nitride crystal placed in the reactor, by an ammonothermal method in the presence of ammonia and the mineralizer.

2. The process of claim 1, wherein the ammonia is cooled below the boiling point of ammonia before the reactant gas is introduced.

3. The process of claim 1, wherein the nitride crystal has an oxygen concentration of at most $5 \times 10^{18}$ atom/cm$^3$.

4. The process of claim 1, wherein the reactant gas is a hydrogen halide gas.

5. The process of claim 4, wherein the reactant gas is at least one member selected from the group consisting of a hydrogen chloride gas, a hydrogen bromide gas, and a hydrogen iodide gas.

6. The process of claim 1, wherein the reactant gas has a water content of at most 10 ppm by weight.

7. The process of claim 1, wherein the reactant gas has an oxygen content of at most 10 ppm by weight.

8. The process of claim 1, wherein the reactant gas is formed by reacting a plurality of material gases.

9. The process of claim 1, wherein the reactant gas is passed through a filter and then introduced.

10. The process of claim 1, wherein the reactor is lined with at least one metal or with an alloy of at least one metal, selected from the group consisting of Pt, Ir, W, Ta, Rh, Ru, and Re.

11. The process of claim 1, wherein the reactor is an autoclave.

12. The process of claim 1, wherein the reactor is an inner cylindrical tube inserted in an autoclave.

13. The process of claim 1, wherein, before ammonia is introduced into the reactor, the interior of the reactor, comprising a starting material suitable for growth of a crystal, is replaced with a nitrogen gas.

14. The process of claim 1, wherein, before ammonia is introduced into the reactor, a pressure in the reactor, comprising the starting material suitable for growth of a nitride crystal, is reduced to at most 10 Torr.

15. The process of claim 1, wherein, before ammonia is introduced into the reactor, the interior of the reactor, comprising the starting material suitable for growth of a nitride crystal, is heated to at least 70° C.

16. The process of claim 1, wherein the nitride crystal is a Group III nitride crystal.

17. The process of claim 1, wherein the nitride crystal is a nitride crystal comprising gallium.

18. The process of claim 17, wherein the starting material suitable for growth of a nitride crystal comprises at least one selected from the group consisting of metal gallium and gallium nitride.

19. The process of claim 18, wherein the starting material suitable for growth has an oxygen concentration of at most $1 \times 10^{18}$ atom/cm$^3$.

20. The process of claim 1, wherein a seed crystal is put in the reactor before growing the crystal.

21. The process of claim 1, wherein the nitride crystal is gallium nitride.

22. The process of claim 1, wherein the nitride crystal has an oxygen concentration of at most $5 \times 10^{17}$ atom/cm$^3$.

23. The process of claim 1, wherein the nitride crystal has an oxygen concentration of at most $1 \times 10^{17}$ atom/cm$^3$.

24. A process for producing a nitride crystal, comprising:
   bringing (a) a reactant gas, which is reactive with ammonia to form a mineralizer, and (b) ammonia into contact with each other in a reactor, to produce a mineralizer in the reactor; and
   in the same reactor in which the mineralizer is formed, growing a nitride crystal from a starting material suitable for growth of a nitride crystal placed in the reactor, by an ammonothermal method in the presence of ammonia and the mineralizer, wherein
   the reactant gas is formed by reacting a plurality of material gases,
   wherein the plurality of material gases comprise a first material gas and a second material gas,
   wherein the first material gas is a halogen, and
   the second material gas is reactive with a halogen to form the reactant gas.

25. The process of claim 24, wherein the second material gas is a gas of at least one member selected from the group consisting of an alkane and a halogenated alkane having a hydrogen atom.

26. The process of claim 24, wherein the first material gas is a chlorine gas, and the second material gas is a gas of at least one member selected from the group consisting of methane, monochloromethane, dichloromethane, and trichloromethane.

27. A process for producing a nitride crystal, comprising:
   introducing (a) a reactant gas or a plurality of material gasses forming the reactant gas, wherein the reactive gas is reactive with ammonia to form a mineralizer, into a reactor charged with (b) ammonia, to produce a mineralizer in the reactor; and
   in the same reactor in which the mineralizer is produced, growing a nitride crystal from a starting material suitable for growth of a nitride crystal placed in the reactor, by an ammonothermal method in the presence of ammonia and the mineralizer,
   wherein, before ammonia and the reactant gas, or ammonia and the plurality of material gases are introduced into the reactor, the pressure in the reactor, comprising the starting material suitable for growth of a nitride crystal, is reduced to at most 10 Torr.

* * * * *